United States Patent
Smith et al.

(10) Patent No.: US 7,445,943 B2
(45) Date of Patent: Nov. 4, 2008

(54) MAGNETIC TUNNEL JUNCTION MEMORY AND METHOD WITH ETCH-STOP LAYER

(75) Inventors: Kenneth H. Smith, Chandler, AZ (US); Brian R. Butcher, Queen Creek, AZ (US); Gregory W. Grynkewich, Gilbert, AZ (US); Srinivas V. Pietambaram, Chandler, AZ (US); Nicholas D. Rizzo, Gilbert, AZ (US)

(73) Assignee: Everspin Technologies, Inc., Chandler, AZ (US)

( * ) Notice: Subject to any disclaimer, the term of this patent is extended or adjusted under 35 U.S.C. 154(b) by 124 days.

(21) Appl. No.: 11/584,411

(22) Filed: Oct. 19, 2006

(65) Prior Publication Data

US 2008/0096290 A1 Apr. 24, 2008

(51) Int. Cl.
H01L 21/00 (2006.01)

(52) U.S. Cl. ............. 438/3; 438/733; 257/E21.17; 257/E21.208; 257/E21.209; 257/E21.218; 257/E21.231; 257/E21.646

(58) Field of Classification Search ............. 438/3, 438/513, 680, 723, 733, 740
See application file for complete search history.

(56) References Cited

U.S. PATENT DOCUMENTS

| | | | |
|---|---|---|---|
| 6,365,419 B1 * | 4/2002 | Durlam et al. | 438/3 |
| 6,518,588 B1 | 2/2003 | Parkin et al. | |
| 7,023,724 B2 * | 4/2006 | Katti | 365/158 |
| 7,116,575 B1 * | 10/2006 | Katti | 365/158 |
| 7,120,048 B2 * | 10/2006 | Sundstrom | 365/158 |
| 7,144,744 B2 * | 12/2006 | Lien et al. | 438/3 |
| 7,169,623 B2 * | 1/2007 | Ditizio | 438/3 |
| 2005/0140012 A1 | 6/2005 | Jung | |
| 2005/0207064 A1 | 9/2005 | Costrini et al. | |
| 2005/0277206 A1 | 12/2005 | Gaidis et al. | |
| 2006/0224948 A1 | 2/2006 | Oh et al. | |
| 2006/0051881 A1 | 3/2006 | Ditizio | |

OTHER PUBLICATIONS

Baik, K, et al., Comparison of plasma etch chemistries for MgO—Applied Surface Science 183 (2001) 26-32.
International Search Report and Written Opinion.

* cited by examiner

Primary Examiner—David Nhu
(74) Attorney, Agent, or Firm—Ingrassia Fisher & Lorenz, P.C.

(57) ABSTRACT

Methods and apparatus are provided for magnetoresistive memories employing magnetic tunnel junction (MTJ). The apparatus comprises a MTJ (61, 231), first (60, 220) and second (66, 236) electrodes coupled, respectively, to first (62, 232) and second (64, 234) magnetic layers of the MTJ (61, 231), first (54, 204) and second (92, 260) write conductors magnetically coupled to the MTJ (61, 231) and spaced apart from the first (60, 220) and second (66, 236) electrodes, and at least one etch-stop layer (82, 216) located between the first write conductor (54, 204) and the first electrode (60, 220), having an etch rate in a reagent for etching the MTJ (61, 231) and/or the first electrode (60, 220) that is at most 25% of the etch rate of the MTJ (61, 231) and/or first conductor (60, 220) to the same reagent, so as to allow portions of the MTJ (61, 231) and first electrode (60, 220) to be removed without affecting the underlying first write conductor (54, 204). In a further embodiment, a second etch-stop layer (90, 250) is located between the second electrode (66, 236) and the second write conductor (92, 260). Improved yield and performance are obtained.

14 Claims, 11 Drawing Sheets

MAGNETIC TUNNEL JUNCTION MEMORY AND METHOD WITH ETCH-STOP LAYER

TECHNICAL FIELD

The present invention generally relates to electronic devices, and more particularly to electronic devices employing a magnetic tunnel junction (MTJ), especially magnetoresistive random access memory (MRAM) structures.

BACKGROUND

It is known to form magnetoresistive random access memory (MRAM) structures using magnetic tunnel junction (MTJ) devices. By providing interconnected arrays of MTJ devices with their associated read and write lines, large MRAM arrays can be formed. Since large numbers of MTJ devices are often needed in such arrays, it is important to have a high manufacturing yield and optimum electrical properties. It has been found that the structures and processes used to form interconnected arrays of MTJ devices and their associated read and write lines are less than optimum. For example and not intended to be limiting, various insulating layers needed to separate the read and write lines (also referred to as local interconnects for read and bit and digit or program lines for write) from the MTJ devices must often be made thicker for processing yield purposes than is desired for electrical purposes, thereby adversely affecting electrical properties of the devices. Conversely, if such dielectric layers are thinned in order to improve the electrical properties of the devices, then manufacturing yield can be significantly degraded. Thus, there continues to be a need for improved MRAM structures employing MTJ devices and their associated read and write lines, especially for structures that can be easily manufactured with improved yield and electrical properties.

Accordingly, it is desirable to provide an improved MRAM and MTJ structure and method. In addition, it is desirable that the MRAM and MTJ structure and method be simple, rugged and reliable, and further, be compatible with semiconductor device and integrated circuit structures and fabrication methods, and preferably but not essentially adapted to be formed on the same substrate. It is further desirable that the improved MRAM and MTJ structure and method reduce or eliminate various process defect causes so that improved manufacturing yield may be obtained. Other desirable features and characteristics of the invention will become apparent from the subsequent detailed description and the appended claims, taken in conjunction with the accompanying drawings and the foregoing technical field and background.

BRIEF DESCRIPTION OF THE DRAWINGS

The invention will hereinafter be described in conjunction with the following drawing figures, wherein like numerals denote like elements.

DETAILED DESCRIPTION

Figure 1:
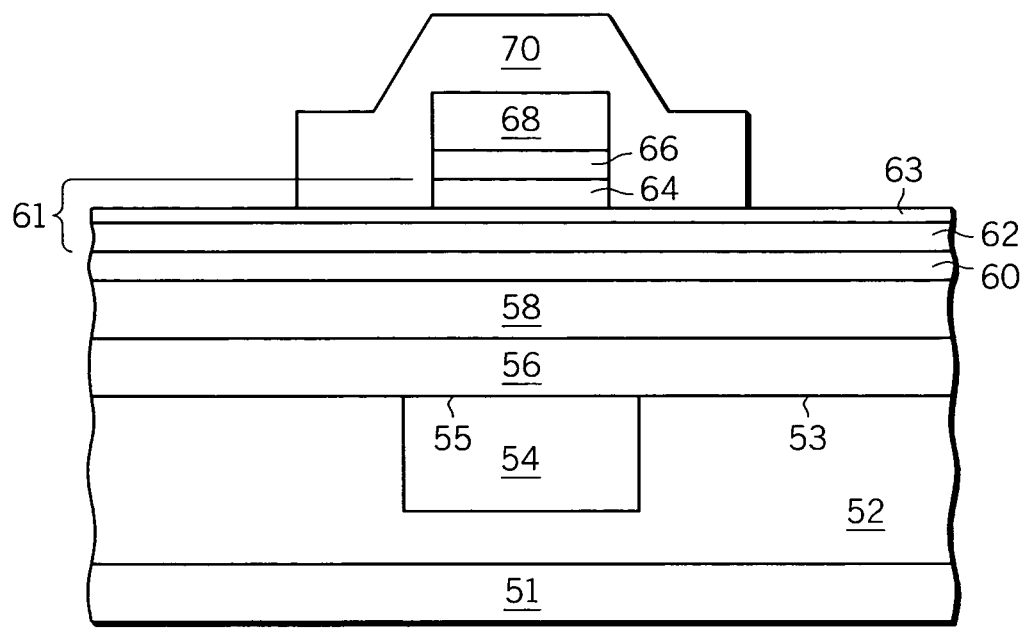
FIG. 1 is a simplified schematic cross-sectional view of a partially completed magnetoresistive random access memory (MRAM) bit employing a magnetic tunnel junction (MTJ) device.

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawings figures are not necessarily drawn to scale. For example, the dimensions of some of the elements or regions in the figures may be exaggerated relative to other elements or regions to help improve understanding of embodiments of the invention.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements, but may include other elements not expressly listed or inherent to such process, method, article, or apparatus.

The terms "left," "right," "in," "out," "front," "back," "up," "down," "top," "bottom," "over," "under," "above," "below" and the like in the description and the claims, if any, are used for descriptive purposes and not necessarily for describing permanent relative positions. It is to be understood that the terms so used are interchangeable under appropriate circumstances such that embodiments of the invention described herein are, for example, capable of operation in other orientations than those illustrated or otherwise described herein. The term "coupled," as used herein, is defined as directly or indirectly connected in an electrical or non-electrical manner.

This invention concerns the use of one or more etch-stop layers in the structure and manufacture, in various embodiments, of MRAM bits employing magnetic tunnel junctions. In order to facilitate understanding of various locations within the device structures and manufacturing stages where such etch-stop layer or layers can be beneficially employed, the etch-stop layers or regions in FIGS. 3-8 and 12-26 are hatched. This is intended to make them more easily visible in relation to other device layers or regions and is not intended to be limiting. Nothing herein is intended to imply that the etch-stop layers or regions described herein are limited merely to the positions shown in the various embodiments.

Figure 11:
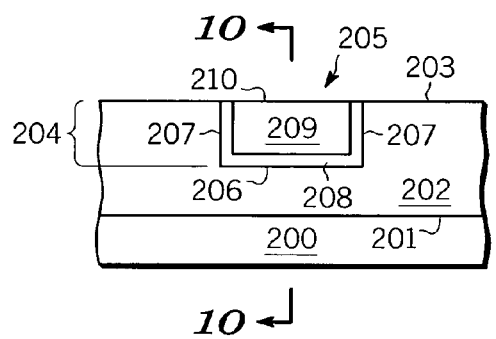
Figure 12:
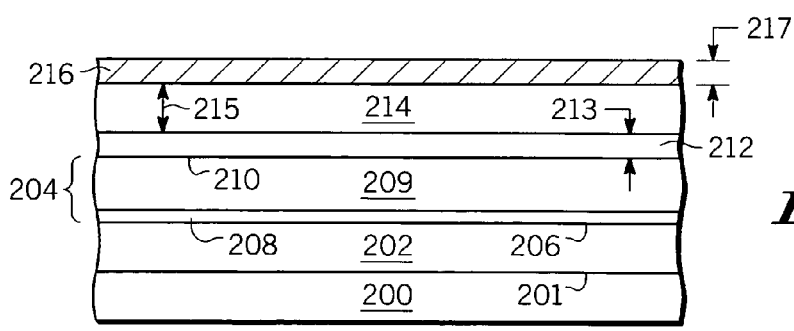
Figure 13:
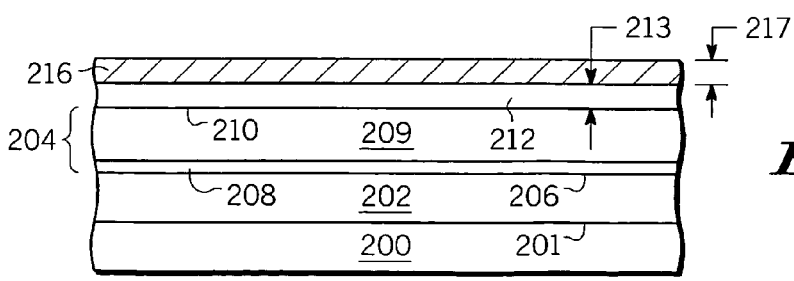
Figure 14:
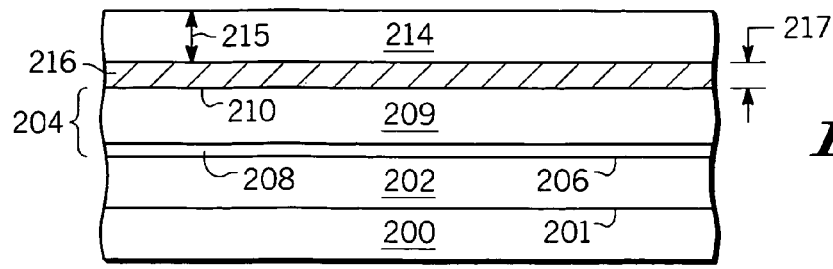
Figure 15:
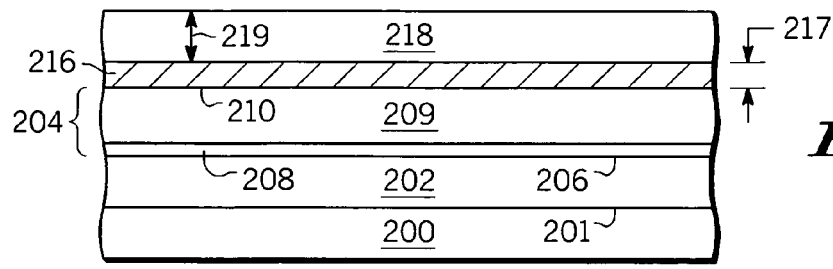
Figure 16:
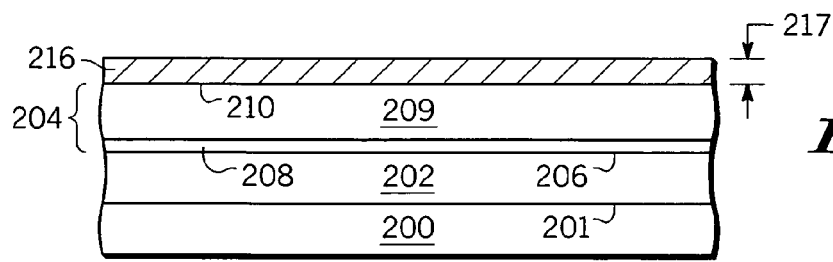

FIG. 1 is a simplified schematic cross-sectional view of partially completed magnetoresistive random access memory (MRAM) bit 50 employing magnetic tunnel junction (MTJ) device 61. MRAM bit 50 comprises substrate 51 on which is provided insulating dielectric 52. Silicon is a non-limiting example of a material suitable for substrate 51 but other materials may also be used. Silicon oxide is a non-limiting example of a material useful for dielectric 52. Conductor 54, often referred to as a "write line" or "programming line" or "digit line," is embedded in dielectric 52. Copper is a suitable material for conductor 54 but other relatively high conductivity materials may also be used. NiFe magnetic cladding (not shown) is often provided on the bottom and lateral sides of conductor 54 but this is not essential and is omitted in FIGS. 1-6 to avoid unnecessarily cluttering these drawings. (Conductor 204 of FIG. 11 is analogous to conductor 54 and illustrates the use of magnetic cladding 208 on lateral sides 207 and bottom 206 of copper core conductor 209.) Upper surface 53 of dielectric 52 and upper surface 55 of conductor 54 are covered by first dielectric layer 56 of for example and not intended to be limiting, plasma deposited silicon nitride, which is covered by second dielectric layer 58 of, for example and not intended to be limiting, silicon oxide formed for example, by thermal reaction of tetra-ethyl ortho-silicate (TEOS), but other dielectric materials formed in these or other ways can also be used for layers 56, 58. Layer 56 is conveniently about 650 Angstrom Units thick and layer 58 is conveniently about 1500 Angstrom Units thick, but thicker and thinner layers can also be used. Conductive electrode layer 60 is formed on dielectric layer 58. Ta, TaN and/or combinations thereof are non-limiting examples of materials suitable for electrode layer 60, but other conductive materials may also be used such as Al and Al alloys, Ti, TiN, combinations of these, and so forth MTJ 61 comprises lower magnetic layer 62, thin tunneling dielectric layer 63 and upper magnetic layer 64. Lower magnetic layer 62 is formed in contact with or otherwise coupled to electrode 60. Layer 62 is conveniently formed from various magnetic materials such as for example and not intended to be limiting, PtMn, IrMn, CoFe, CoFeB, NiFe, NiFeCo, and/or combinations thereof, adapted to having their magnetic spin vectors aligned and pinned, that is, made resistant to reorientation by the magnetic fields to which MTJ 61 may be exposed during operation. Thin tunneling dielectric layer 63 between lower magnetic layer 62 and upper magnetic layer 64 provides the tunnel barrier on which the operation of MTJ 61 is based. Aluminum oxide is a suitable material for tunneling dielectric 63. Other dielectric materials able to support tunneling magnetoresistance (TMR) may also be used. Upper magnetic layer 64 of MTJ 61 is provided on tunneling dielectric layer 63. NiFe is a non-limiting example of a suitable material for upper magnetic layer 64 but other magnetic materials may also be used capable of having their magnetic moments aligned and rotated by the operating magnetic fields to which MTJ 61 is exposed during a programming operation. Such MTJ devices are well known in the art.

Upper conductive electrode 66 is formed on upper magnetic layer 64 and laterally patterned along with overlying insulating dielectric layer or region 68, e.g., of TEOS generated silicon oxide. The combination of upper conductive electrode 66, upper magnetic layer 64, and insulating layer or region 68 are covered by localized mask 70 of, for example and not intended to be limiting, TEOS derived silicon oxide, silicon oxide, silicon nitride formed in various ways and other suitable non-conducting materials, or combinations thereof. Mask 70 is used to etch MRAM bit 50 to electrically separate it from adjacent bits so that interconnected arrays of such bits may be formed on common substrate or support 51. The sequence of layers described above may be used to form multiple MRAM bits on common substrate 51 that can be interconnected to form an MRAM array structure. At a later stage of manufacture not illustrated here, another write line conductor is provided above electrode 66.

Figure 2:
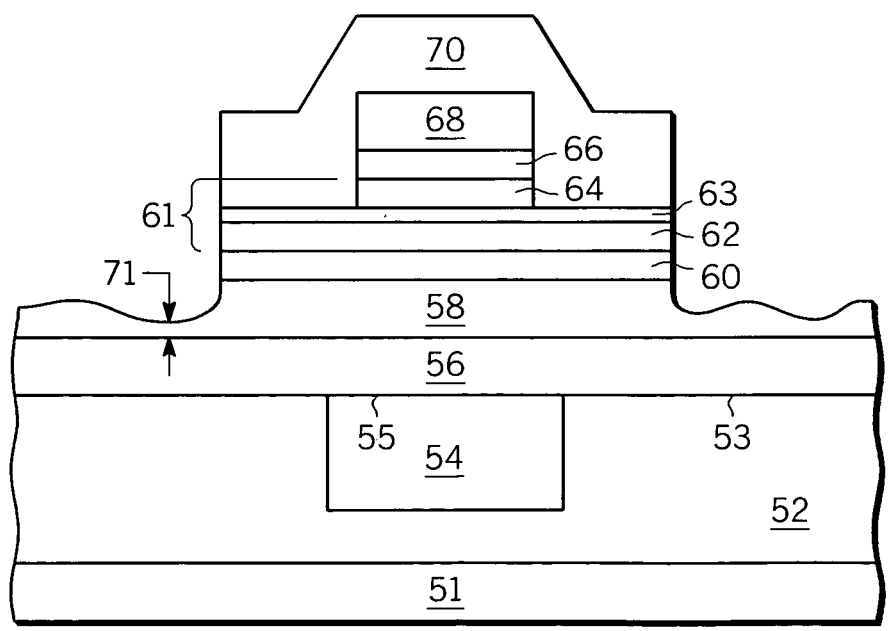
FIG. 2 is a simplified schematic cross-sectional view of the partially completed magnetoresistive random access memory (MRAM) bit of FIG. 1 at a later stage of manufacture, illustrating problems that arise when an etching step is performed to electrically separate a particular bit from adjacent bits formed at the same time on the same substrate.

FIG. 2 is a simplified schematic cross-sectional view of partially completed magnetoresistive random access memory (MRAM) bit 50 of FIG. 1 at a later stage of manufacture, illustrating a problem that arises when an etching step is performed to electrically separate a particular bit from adjacent bits formed at the same time on common substrate 51. In order to electrically separate individual MRAM bits 50, it is desired to etch vertically through MTJ 61 and underlying electrode 60 without etching underlying conductor 54 or otherwise adversely affecting conductor 54. One of the reasons why this is an important aspect of the manufacturing process is that the etch chemistry used to optimally etch through some or all of layers 60-66 generally involves chlorine or other halogen containing reagents (plasma etching is preferred), which etchants quickly attack the copper preferentially used for conductor 54, and/or the magnetic cladding (not shown) that is often formed on the lateral sides (and bottom) of write line 54. This etching step (see FIG. 2) is generally accomplished by using a timed etch into oxide layer 58 to clear those portions of layers 60-66 desired to be removed while, hopefully, leaving portion 71 of dielectric layer 58 in place after etching. Unfortunately, such etching procedures are often non-uniform, penetrating deeper into layer 58 and layer 56 on some portions of substrate 51 than on other portions of substrate 51 where other MRAM bits have been formed. Nitride layer 56 is conveniently provided to limit copper out-diffusion from conductor 54 into other parts of the device, but provides no significant etch-stop function since it etches at substantially the same rate as oxide layer 58 in the reagents (e.g., halogen containing plasmas) used for etching MTJ 61 and its associated electrodes (e.g., 60, 66). The etching problem is often exacerbated by the tendency of conductor 54 formed of copper to develop hillocks or other surface irregularities that may cause the thickness of layers 56, 58 to vary so that some regions of layers 56, 58 may etch through more quickly than other regions. As a consequence, the yield of useful MRAM bits can be adversely affected. This problem may be ameliorated by increasing the thickness of layers 58 and/or 56, but this is not desirable since increasing the separation between conductor 54 and MTJ 61 can degrade the electrical properties of MRAM bit 50 by increasing the current through conductor 54 needed to produce the same net magnetic field at MTJ 61. This is undesirable.

Figure 3:
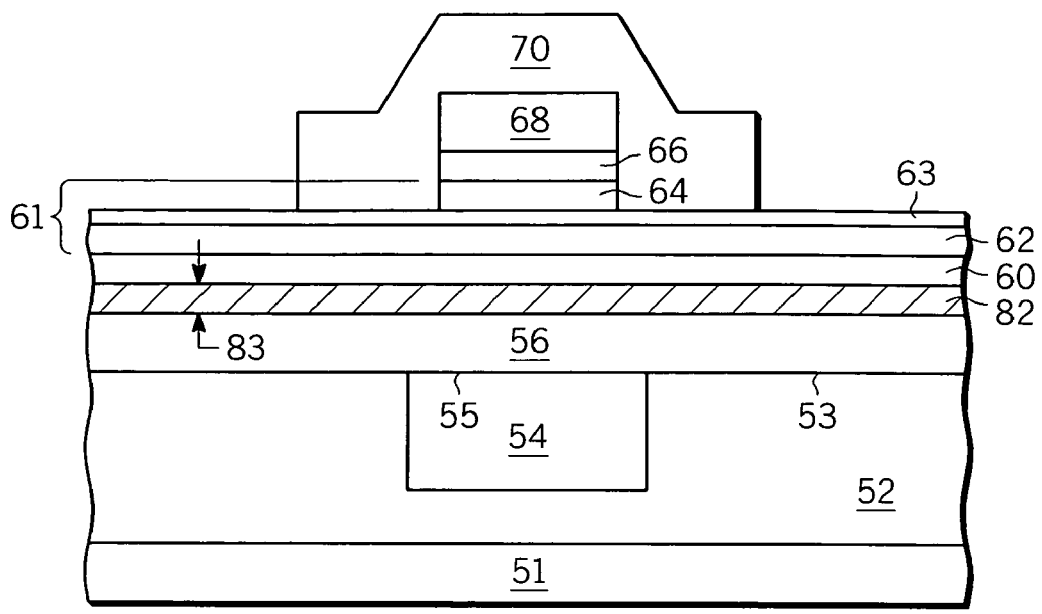
FIG. 3 is a simplified schematic cross-sectional view of a partially completed magnetoresistive random access memory (MRAM) bit employing a magnetic tunnel junction (MTJ) device, analogous to that of FIG. 1 but according to an embodiment of the invention wherein a first etch stop layer is included.
Figure 4:
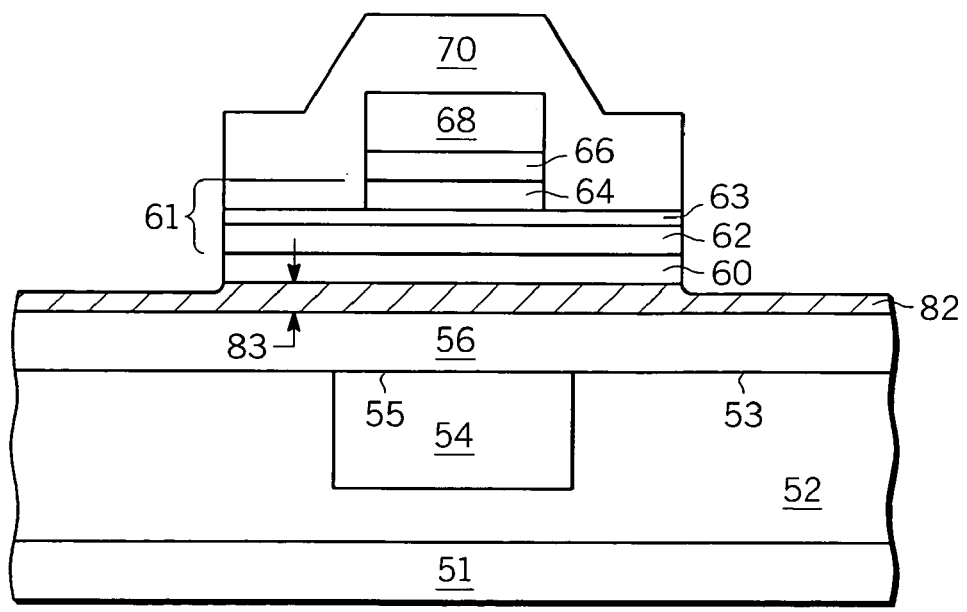
FIG. 4 is a simplified schematic cross-sectional view of the partially completed MRAM bit of FIG. 3 illustrating the same etching step as shown in FIG. 2.

FIG. 3 is a simplified schematic cross-sectional view of partially completed magnetoresistive random access memory (MRAM) bit 80 employing magnetic tunnel junction (MTJ) device 61, analogous to that of FIG. 1 but according to an embodiment of the invention wherein first etch stop layer 82 is included. FIG. 4 is a simplified schematic cross-sectional view of partially completed MRAM bit 80 of FIG. 3 illustrating the same etching step as shown in FIG. 2. Like reference numbers are used in FIGS. 3-4 as in FIGS. 1-2 to identify common regions and/or layers shared with MRAM bit 50 of FIGS. 1-2, and the discussion thereof in connection with FIGS. 1-2 is incorporated herein by reference. MRAM bit 80 of FIGS. 3-4 differs from MRAM bit 50 of FIGS. 1-2 in that dielectric layer 58 of MRAM bit 50 has been replaced by etch-stop layer 82. Etch-stop layer 82 is conveniently a dielectric (as is layer 58) but has the important distinction that it is resistant to the etch chemistry needed to etch through all or part of layers 60-64 (or layers 60-66), that is the layers forming MTJ 61 and its lower electrode 60. When chlorine or other halogen etch chemistry is employed for this purpose, it has been found that magnesium oxide, aluminum oxide, aluminum nitride and/or combinations thereof are suitable materials for etch stop layer 82. Magnesium oxide is preferred. Magnesium oxide, aluminum oxide, aluminum nitride and combinations thereof may be formed by a variety of familiar techniques, such as for example and not intended to be limiting, chemical vapor deposition (CVD), plasma enhanced chemical vapor deposition (PECVD), reactive or non-reactive sputtering, chemical oxidation of deposited metal, combinations thereof and so forth. For the preferred embodiment, radio frequency (RF) sputtering from a magnesium oxide target is preferred. Argon or argon-oxygen gas mixtures are non-limiting examples of suitable sputtering gases, but other gases and gas mixtures may also be used. RF sputtering with $Ar:O_2$ mixtures in the range of about 1:1 to 20:1 is useful, with about 3:1 to 15:1 being convenient and about 6:1 to 12:1 being preferred. It was found that magnesium oxide layers had etch rates of only about 2.5-7.0% of the etch rate of, for example, lower magnetic layer 62 and/or lower electrode 60 when exposed to halogen based anisotropic etches which were found to be effective for removing MTJ 61 and lower electrode layer 60 where desired. Plasma enhanced etching using chlorine or fluorine containing gases, e.g., Cl:Ar and/or Fl:Ar mixtures, are non-limiting examples of suitable plasma etchants for MTJ 61 and/or lower electrode 60. Such differential etch rates of magnesium oxide etch-stop layer 82 are more than sufficient to allow MTJ 61 and lower electrode 60 to be cleared from areas where they are desired to be removed without attacking or degrading underlying dielectric 52 and/or conductor 54. Substantial improvement in manufacturing yield was obtained.

Thickness 83 of layer 82 is usefully in the range of about 100 to 1200 Angstrom Units, conveniently in the range of about 200 to 800 Angstrom Units, and preferably in the vicinity of about 250-450 Angstrom Units, but other thicknesses may also be used. This is less than the customary thickness for layer 58 (e.g., about 1500 Angstrom Units) resulting in improved magnetic coupling between conductor 54 and MTJ 61 so that in addition to improving device yield, improved electrical properties are also obtained. Layer 82 is referred to as an etch-stop layer since it is chosen to be substantially impervious to the etch chemistry used for etching through MTJ 61 and associated lower electrode 60. The term "substantially impervious" is used herein to indicate that the etch rate of layer 82 when exposed to the reagents needed for removing portions of layers 60-64 is sufficiently small compared to the etch rate of layers 60-64, that the portions of layers 60-64 desired to be removed may be substantially cleared without layer 82 being eroded so as to expose underlying layer 56 (if present) and/or conductor 54 and dielectric 52. Thus, it is not necessary that the etch rate of etch-stop layer 82 be zero to the reagents of interest, only that it be sufficiently slow compared to the etch rate of for example, layers 60-64, that the desired portions thereof may be readily cleared without substantially etching through layer 82. It is believed that the above-described structure and process are workable with differential etch rates for the etch-stop layer compared to the materials being cleared in its presence, usefully of about ≦25%, more conveniently of about ≦15% and preferably of about ≦10% and the term "substantially impervious" as used herein is intended to include these ranges of differential etch rates. As noted above, differential etch rates in the range of about 2.5-7.0% were obtained using magnesium oxide for etch-stop layer 82 compared to the etch rate with the same reagents for the layers forming MTJ 61 and lower electrode 60. It has also been found that the etch rate of MgO is some 20 times slower (e.g., ≦5%) in this etch chemistry than the etch rate of TEOS formed silicon oxides or plasma deposited nitrides used for example in layers 56, 58 and elsewhere in such MRAM structures. This is a great convenience.

Figure 5:
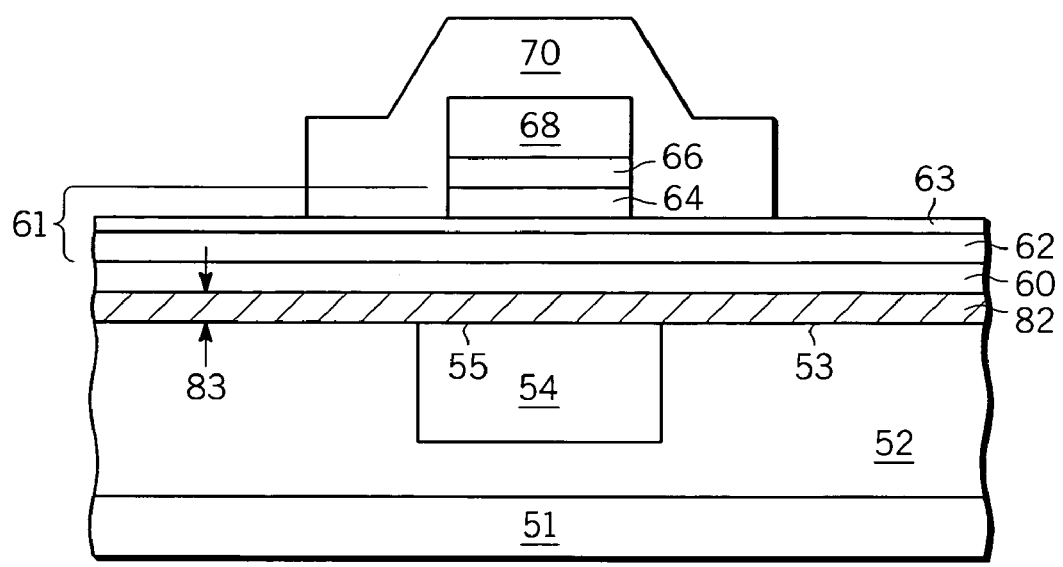
FIG. 5 is a simplified schematic cross-sectional view of a partially completed MRAM bit analogous to that of FIG. 3, but according to a further embodiment of the invention, wherein the etch-stop layer is in a different location.
Figure 6:
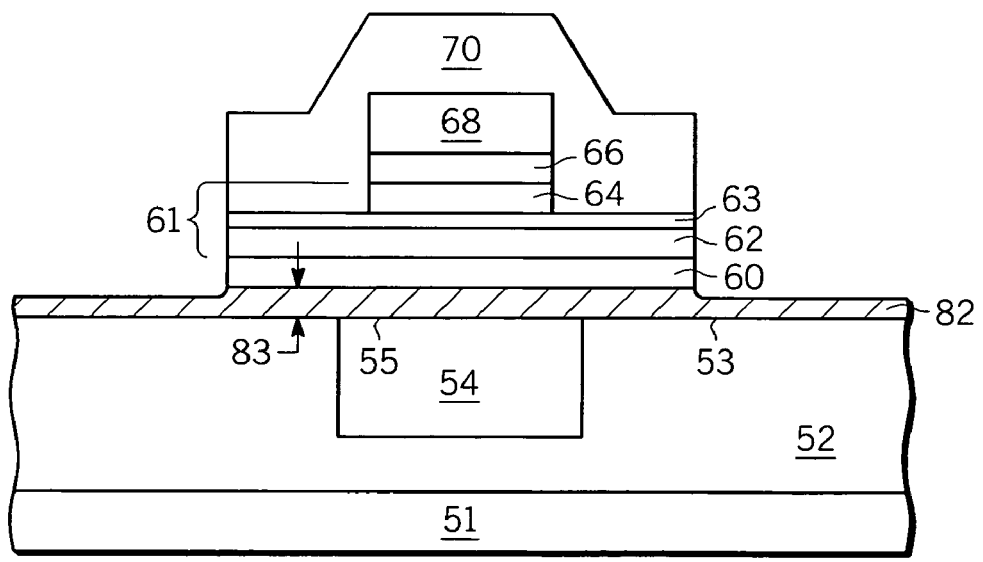
FIG. 6 is a simplified schematic cross-sectional view of the partially completed MRAM bit of FIG. 5 illustrating the same etching step as shown in FIG. 4.

FIG. 5 is a simplified schematic cross-sectional view of partially completed MRAM bit 84 analogous to bit 80 of FIG. 3, but according to a further embodiment of the invention, wherein etch-stop layer 82 is in a different location than in FIG. 3. FIG. 6 is a simplified schematic cross-sectional view of partially completed MRAM bit 84 of FIG. 5 illustrating the same etching step as shown in FIG. 4. Like reference numbers are used in FIGS. 5-6 as in FIGS. 3-4 to identify common regions and/or layers shared with MRAM bit 80 of FIGS. 3-4, and the discussion thereof in connection with FIGS. 3-4 is incorporated herein by reference. MRAM bit 84 of FIGS. 5-6 differs from MRAM bit 80 of FIGS. 3-4 in that dielectric layer 56 of MRAM bit 80 has been omitted. Thus, compared to bit 50 of FIGS. 1-2, both layers 56 and 58 have been replaced by etch-stop layer 82 in MRAM bit 84. This further reduces the separation of conductor 54 from MTJ 61 in bit 84 compared to bit 50, thereby further enhancing the electrical properties of bit 84 compared to bit 50, while at the same time improving the manufacturing yield. The same considerations apply concerning the choice of the material and the meaning of the term "substantially impervious" and relative etch rates concerning etch-stop layer 82 of bit 84 of FIGS. 5-6 as for etch-stop layer 82 of bit 80 of FIGS. 3-4 and the discussion thereof in connection with FIGS. 3-4 is incorporated herein by reference.

Figure 7:
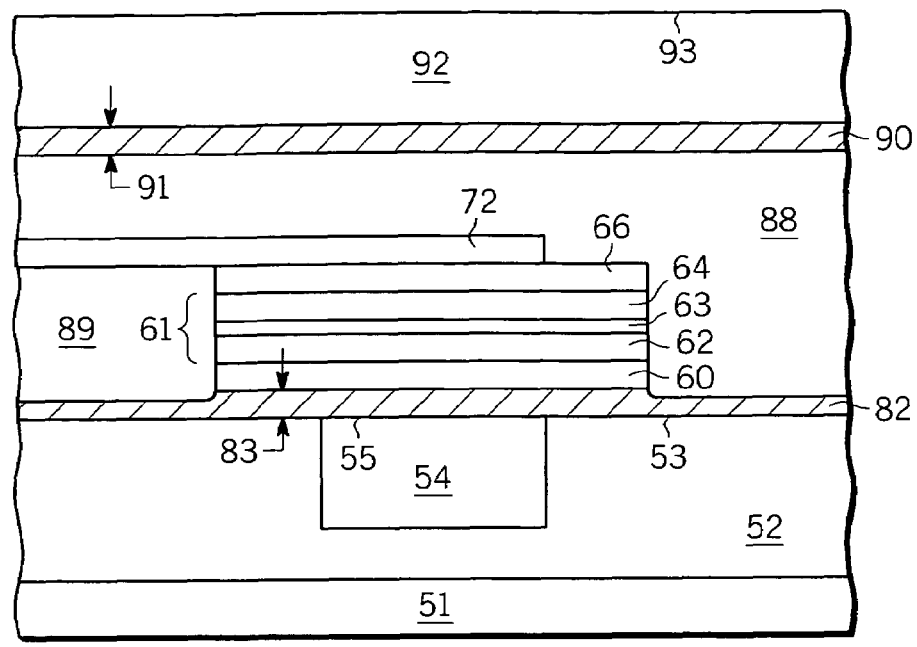
FIGS. 7 and 8 are simplified schematic cross-sectional views of MRAM bits analogous to the MRAM bit of FIG. 5 wherein further etch-stop layers or regions are provided according to still further embodiments of the invention and showing further details.
Figure 8:
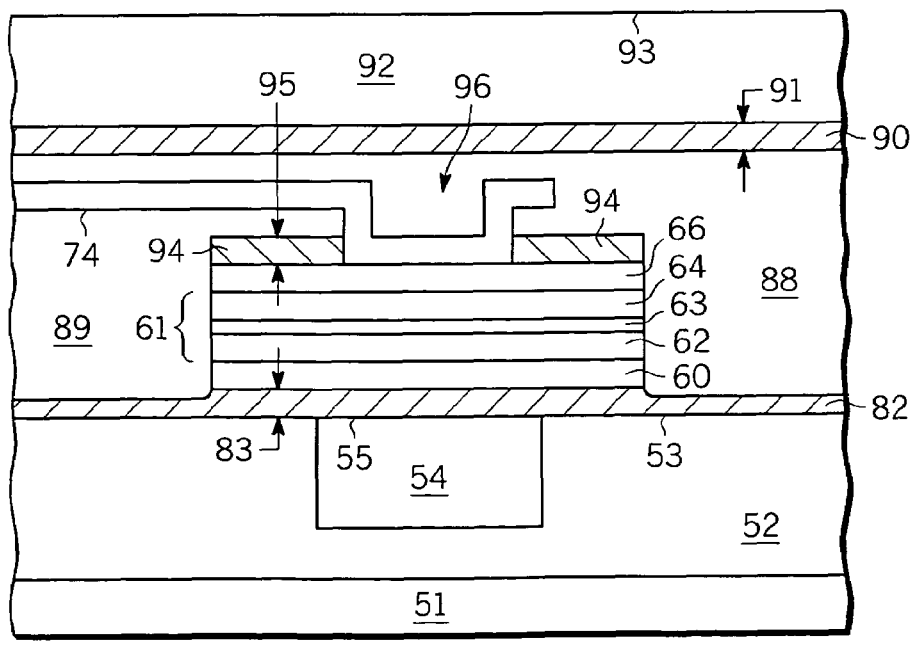
Figure 9:
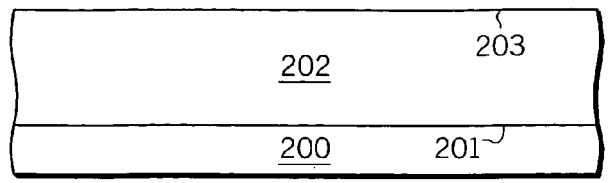
FIGS. 9-26 are simplified schematic cross-sectional views of an MRAM bit employing a MTJ at different stages of manufacture and incorporating one or more etch-stop layers, according to additional embodiments of the invention.

FIGS. 7 and 8 are simplified schematic cross-sectional view of completed MRAM bit 86 analogous to partially completed MRAM bit 84 of FIGS. 5-6, showing further details and having further etch-stop layers or regions according to still further embodiments of the invention. Elements 51, 52, 53, 54, 55, 61, 60, 62, 63, 64, 66 and 82 of FIGS. 7-8 are substantially the same as in MRAM bit 84 of FIGS. 5-6 and the discussion thereof in connection with FIGS. 5-6 is incorporated herein by reference. In FIGS. 7-8, lower electrode 60 and upper electrode 66 are analogous to similarly identified electrodes of FIGS. 5-6. Upper interconnect 72 of FIG. 7 and upper interconnect 74 of FIG. 8 make electrical contact with upper electrode 66 and are shown extending to the left where they can be conveniently coupled to other MRAM bits or other devices or contacts. Analogous interconnects to lower electrode 60 are omitted to avoid unduly cluttering the figures. Additional dielectric layer 89 is provided in device 86 of FIG. 7 and device 87 of FIG. 8 to support and isolate upper interconnects 72, 74 and dielectric layer 88 is provided to insulate upper interconnect 72, 74, upper electrode 66 and MTJ 61 from overlying write conductor (e.g., "bit line") 92. Silicon oxide, silicon nitride and/or mixtures thereof are non-limiting examples of suitable materials for dielectrics 88, 89. Upper conductive interconnects 72 and 74 of FIGS. 7-8 differ slightly in vertical configuration to illustrate various ways in which they may be formed according to different embodiments. Conductor 92 is preferably of copper and conveniently incorporates magnetic cladding (not shown) on upper face 93 and lateral sides parallel to the plane of FIGS. 7-8. Other conductive materials may also be used for conductor 92. Second etch-stop layer 90 of thickness 91 is desirably but not essentially provided between dielectric 88 and write conductor 92. Etch-stop layer 90 is conveniently of substantially the same materials and thickness as etch-stop layer 82 previously described, but this is not essential. Other materials and thicknesses may also be used, that is, one material and thickness may be used for etch-stop layer 82 and another material and/or different thickness used for etch-stop layer 90, depending upon the particular structure being fabricated. Etch-stop layer 90 is useful to protect underlying device regions, e.g., electrodes 66 and interconnects 72, 74, MTJ 61, lower electrode 60, etc., during fabrication of upper (e.g., copper) write conductor 92 and the dielectric layer (not shown) in which it is normally formed. In the absence of etch-stop layer 90, various etching steps used during formation of conductor 92 may degrade the integrity of dielectrics 88, 89 and other layers or regions underlying conductor 92. Device 87 of FIG. 8 differs further from device 86 of FIG. 7 in that third etch-stop region 94 of thickness 95 is provided on MTJ 61 substantially surrounding contact region 96 where upper interconnect 74 makes contact to upper electrode 66 above upper magnetic layer 64 of MTJ 61. The material and thickness of third etch-stop region 94 are conveniently but not essentially similar to those used for etch-stop layer 82 and/or 90 and the discussion thereof in connections with FIGS. 5-7, including the discussion or relative etch rates, is incorporated herein by reference.

FIGS. 9-26 are simplified schematic cross-sectional views of MRAM bit structures 100-132 employing a MTJ at different stages of manufacture 101-133 and incorporating one or more etch-stop regions or layers, according to additional embodiments of the invention. Various examples of useful and/or suitable materials and manufacturing processes are described in connection with FIGS. 9-26, but these are intended merely for convenience of explanation and not intended to be limiting. Persons of skill in the art will understand based on the descriptions herein that other materials and manufacturing processes may also be used for particular regions and layers even though not specifically set forth in connection with a particular structure or manufacturing stage. Where appropriate, the layers and regions shown in FIGS. 9-26 are identified as being analogous to layers or regions in FIGS. 1-8. Accordingly, the descriptions of such analogous layers or regions, e.g., thicknesses, compositions and useful process steps for forming them, etc., given in connection with FIGS. 1-8 are incorporated herein by reference. FIGS. 9-26 should be considered in conjunction with FIGS. 1-8.

Figure 10:
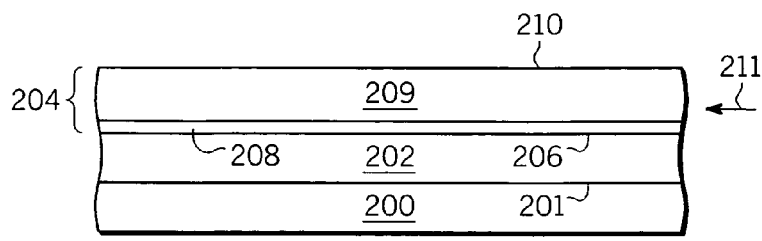

Structure 100 illustrates the outcome of manufacturing stage 101 in which substrate 200 analogous to substrate 51, of for example silicon, having upper surface 201 is provided and on which is formed dielectric (e.g., silicon oxide) layer 202 having upper surface 203, which is analogous to layer 52 of FIGS. 1-8. Structure 102 of FIGS. 10-11 shows the outcome of manufacturing stage 103 in which conductor 204 is formed. FIG. 11 is a view of structure 102 of FIG. 10 taken in the direction of arrow 211 shown in FIG. 10. Conductor 204 is formed in channel 205 in dielectric 202 and is analogous to conductor 54 of FIGS. 1-8. Conductor 204 preferably includes magnetic cladding 208 on three sides of conductive core 209, that is, on sides 207 and bottom 206 of channel 205 in which conductive core 209 is located. Upper surface 210 of conductor 204, that will face toward the MTJ subsequently formed there above, preferably does not have such magnetic cladding. NiFe is a non-limiting example of a suitable material for cladding 208 and copper is preferred for conductive core 209 although other relatively conductive materials may also be used. Conductor 204 is also referred to as programming line, digit line or write line 204.

Structures 104-112 resulting from manufacturing stages 105-113 of FIGS. 12-16 illustrate various further embodiments of the invention in which etch-stop layer 216 (analogous to etch-stop layer 82 of FIGS. 3-8) is combined with other layers useful for the formation of MRAM bits, as for example and not intended to be limiting MRAM bits 80, 84, 86, 87, etc. Manufacturing stages 105-113 do not follow sequentially, but follow independently from manufacturing stage 103 of FIGS. 10-11. Accordingly, they illustrate various alternative embodiments in which etch stop layer 216 analogous to etch-stop layer 82 may or may not be combined with other dielectric layers useful in forming MRAM bits (e.g., one or the other or more of layer 212 analogous to layer 56, layer 214 analogous to layer 58, layer 218, etc.). Each embodiment is described separately. Structure 104 results from manufacturing stage 105 of FIG. 12 in which: (i) first dielectric layer 212 analogous to layer 56 of, for example silicon nitride, is applied over structure 102 of FIGS. 10-11, (ii) second dielectric layer 214 of thickness 215 analogous to layer 58, of for example silicon oxide, is applied over first dielectric layer 212, and (iii) etch-stop layer 216 of thickness 217, of for example magnesium oxide, aluminum oxide and/or aluminum nitride or combinations thereof analogous to etch-stop layer 82 is formed over layer 214. Typical thicknesses and methods of formation of layers 212, 214, 216 are described in connection with their analogous layers illustrated in FIGS. 1-8. Structure 106 results from manufacturing stage 107 of FIG. 13, following manufacturing stage 102 of FIGS. 10-11. In manufacturing stage 107, dielectric layer 212 of thickness 213, of for example silicon nitride, is applied over structure 102 of FIGS. 10-11, and then etch-stop layer 216 of thickness 217 is applied over dielectric layer 212. Dielectric layer 212 is analogous to dielectric layer 56 and etch-stop layer 216 is analogous to layer 82 of FIGS. 3-4. Structure 108 results from manufacturing stage 109 of FIG. 14, following manufacturing stage 102 of FIGS. 10-11. In manufacturing stage 109, etch-stop layer 216 of thickness 217, of for example magnesium oxide, aluminum oxide and/or aluminum nitride or combinations thereof is applied over structure 102 of FIGS. 10-11, and then dielectric layer 214 of thickness 215, of for example silicon oxide, is applied over etch-stop layer 216. Dielectric layer 214 is analogous to dielectric layer 58 in composition and thickness and etch-stop layer 216 is analogous to layer 82 of FIGS. 3-8. Structure 110 results from manufacturing stage 111 of FIG. 15, following manufacturing stage 102 of FIGS. 10-11. In manufacturing stage 111, etch-stop layer 216 of thickness 217, of for example magnesium oxide, aluminum oxide and/or aluminum nitride or combinations thereof is applied over structure 102 of FIGS. 10-11, and then enhanced permeability dielectric layer 218 of thickness 219 is applied over etch-stop layer 216. Dielectric layer 218 is conveniently formed of materials such as TEOS derived silicon dioxide or plasma enhanced nitride that has been impregnated with a magnetically permeable material such as iron or nickel and the like. The enhanced permeability dielectric is useful in that, compared to normal dielectrics, the magnetic field at the magnetic bit arising from a given current in a given programming line a given distance away from the magnetic bit is greater if the enhanced permeability dielectric is employed. Etch-stop layer 216 is analogous to layer 82 of FIGS. 3-4. Structure 112 results from manufacturing stage 113 of FIG. 16, following manufacturing stage 102 of FIGS. 10-11. In manufacturing stage 113, etch-stop layer 216 of thickness 217, of for example magnesium oxide, aluminum oxide and/or aluminum nitride or combinations thereof is applied directly over structure 102 of FIGS. 10-11. Etch-stop layer 216 is analogous to layer 82 of FIGS. 3-8.

Figure 17:
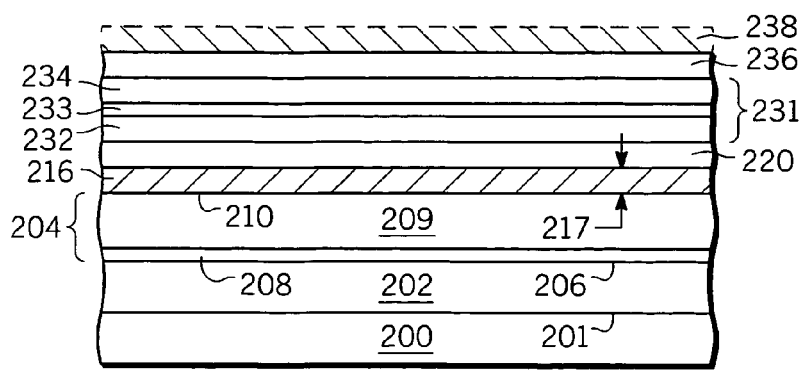

Structure 114 results from manufacturing stage 115 of FIG. 17. Manufacturing stage 115 can follow from any of manufacturing stages 105-113 of FIGS. 12-16. However, for the purpose of illustrating subsequent manufacturing stages it is assumed hereafter that manufacturing stage 115 follows from manufacturing stage 113 of FIG. 16 in which etch-stop layer 216 is applied directly over structure 102 of manufacturing stage 103 and without the additional layers illustrated in FIGS. 12-15, but this is merely for convenience of explanation and not intended to be limiting. Persons of skill in the art will understand based on the description herein that when manufacturing stage 115 follows from any other of manufacturing stages 105-111 of FIGS. 12-15, that the additional layers shown in whichever of structures 104-110 is appropriate are to be included underlying layer 220 in manufacturing stage 117 and subsequent stages. Returning now to FIG. 17, structure 114 results from manufacturing stage 115 in which lower electrode layer 220 analogous to layer 60 of FIGS. 1-8 is applied over etch stop layer 216 (or whatever other layers illustrated in FIGS. 12-15 are being used). Magnetic tunnel junction (MTJ) 231 analogous to MTJ 61 of FIGS. 1-8 comprising lower magnetic layer 232, tunneling dielectric 233, and upper magnetic layer 234 is formed on lower electrode layer 220. Upper electrode 236 is formed over upper magnetic layer 234. Layers 220, 232, 233, 234, 236 are analogous, respectively, to layers 60, 62, 63, 64, 66 of FIGS. 1-8 and the discussion thereof presented in connection with FIGS. 1-8 is incorporated herein by reference. Etch-stop layer 238 of thickness 239, may also be included above upper electrode 236. Etch-stop layer 238 is shown in dashed representation in FIGS. 17-19 to indicate that it is included in some embodiments but not in others, as is explained in connection with FIGS. 20-21. For example, etch-stop layer 238 can be subsequently used to form etch-stop regions 94 of FIG. 8 when such configuration is desired.

Figure 18:
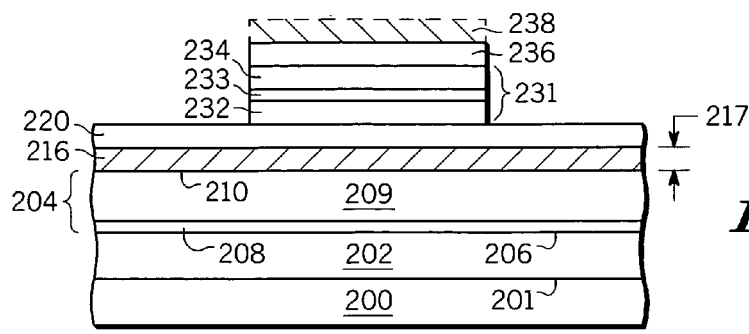
Figure 19:
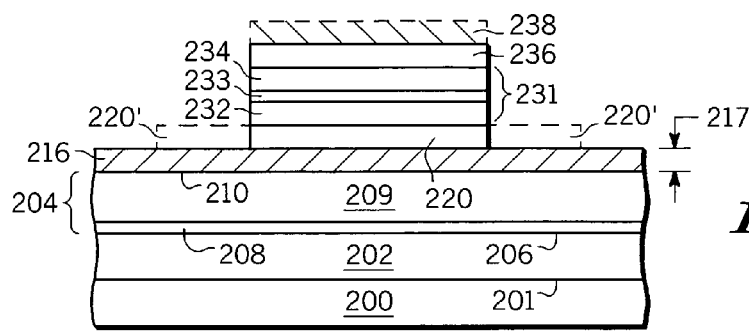

Structure 116 results from manufacturing stage 117 of FIGS. 18, based on structure 114 of FIG. 17. In manufacturing stage 117 of FIG. 18, MTJ 231 comprising layers 232, 233, 234 and upper electrode 236 are masked using means well known in the art and etched to define the lateral extent of MTJ 231 and upper electrode 236. Structure 116 results. Structure 118 results from manufacturing stage 119 of FIG. 19 based on prior structure 116 of manufacturing stage 117 of FIG. 18. Structure 116 of FIG. 18 is masked in manufacturing stage 119 using means well known in the art and lower electrode layer 220 (analogous to layer 60) is partially removed to define its lateral shape and extent. Persons of skill in the art will understand that the lateral shape and extent of electrode 220 can be the same or different than the lateral shape and extend of MTJ 231. Accordingly alternative shape and lateral extent 220' is shown in FIG. 19, but this is not essential. A lower interconnect (not shown) is conveniently used to couple lower electrode layer 220 and therefore MTJ 231 to whatever other MRAM bits and/or other devices or connections may be desired so as to provide an interconnected array of MRAM bits on a common substrate. Such lower interconnects are well understood by persons of skill in the art. Manufacturing stages 117, 119 may be combined. In manufacturing stages 117, 119 etch-stop layer 216 prevents the reagents (e.g., excited halogen containing gases during plasma etching) used in etching lower electrode 220 and any of overlying layers 232, 233, 234, 236 from attacking or damaging underlying conductor 204 or adjacent dielectric 202 (see FIG. 11). In subsequent figures, electrode 220 is assumed to have the same lateral width as MTJ 231 in FIG. 19 and that any interconnects thereto are beyond the plane of the figures and not shown, but this is merely for convenience of illustration and not intended to be limiting.

Figure 20:
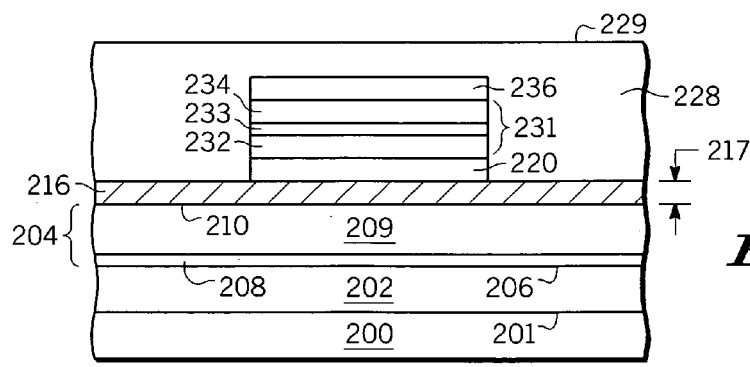
Figure 21:
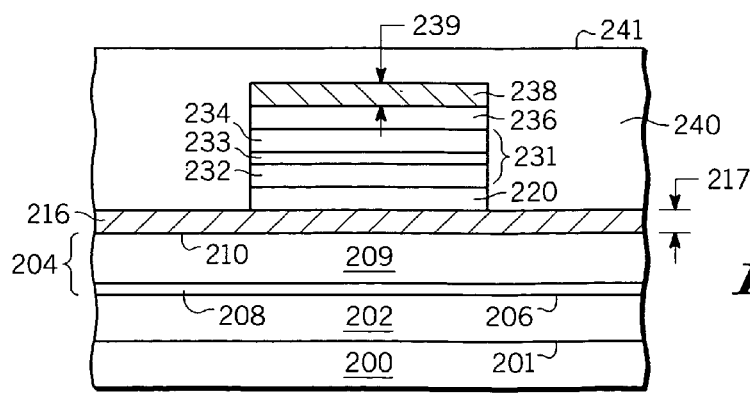

FIGS. 20-21 illustrate subsequent manufacturing stages according to different embodiments depending upon whether or not etch-stop layer 238 is omitted or included in FIGS. 17-19. Structure 120 results from manufacturing stage 121 of FIG. 20 in which dielectric layer 228 is applied over structure 118 of manufacturing stage 119 with etch-stop layer 238 omitted. Dielectric layer 228 is analogous to layer 89 of FIGS. 7-8. Silicon oxide is a non-limiting example of a material suitable for layer 228. Layer 228 has upper surface 229. Upper surface 229 is desirably planarized, that is, rendered smooth and substantially flat by for example, chemical-mechanical polishing, although other procedures may also be used. Planarization is desirable but not essential. Structure 122 results from manufacturing stage 123 of FIG. 21, in which dielectric layer 240 is applied over structure 118 of manufacturing stage 119 with etch-stop layer 238 included. Dielectric layer 240 is analogous to layer 89 of FIGS. 7-8. Silicon oxide is a non-limiting example of a material suitable for layer 240. Layer 240 has upper surface 241. Upper surface 241 is desirably planarized, that is, rendered smooth and substantially flat by for example, chemical-mechanical polishing, although other procedures may also be used. Planarization is desirable but not essential.

Figure 22:
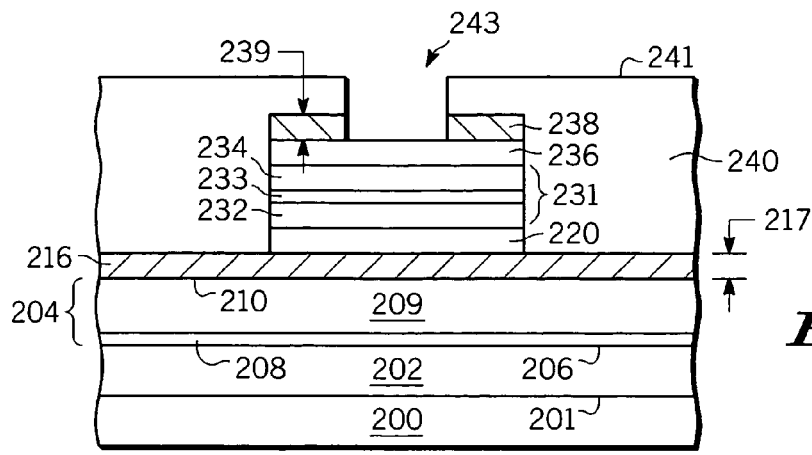
Figure 23:
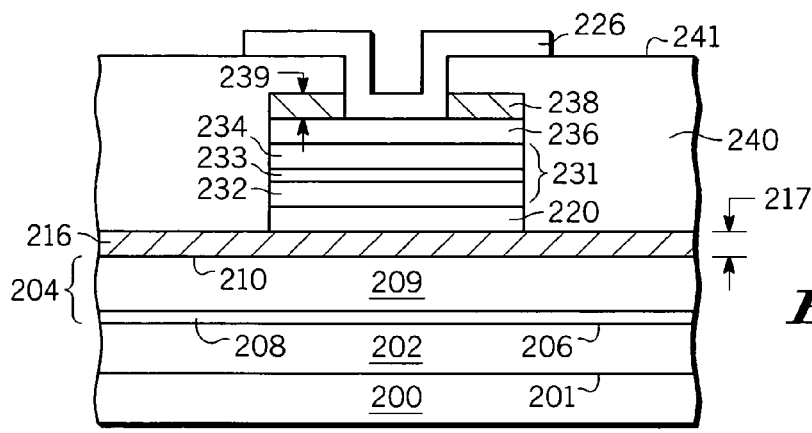
Figure 24:
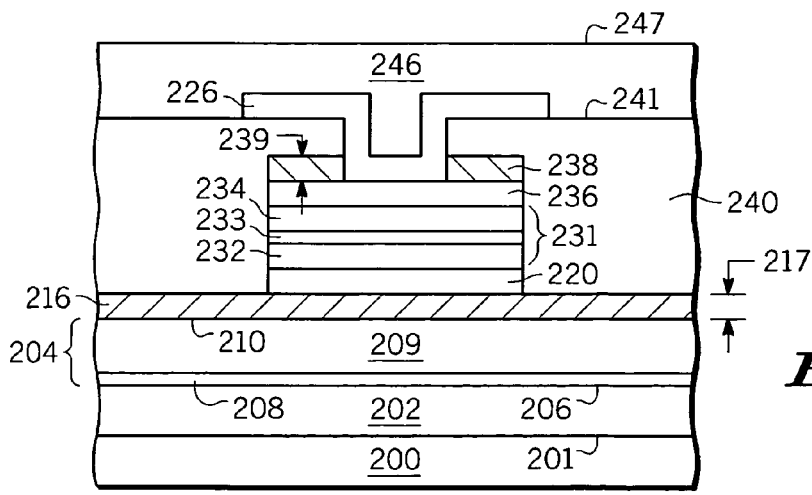

Structure 124 results from manufacturing stage 125 of FIG. 22. Manufacturing stage 125 can follow from either of manufacturing stages 121-123 of FIGS. 20-21, depending upon the desired properties of the MRAM bit being formed. However, for the purpose of illustrating subsequent manufacturing stages it is assumed hereafter that manufacturing stage 125 of FIG. 22 follows from manufacturing stage 123 of FIG. 21 in which etch-stop layer 238 is included, but this is merely for convenience of explanation and not intended to be limiting. Persons of skill in the art will understand based on the description herein that when manufacturing stage 125 follows from either of manufacturing stages 121 or 123 of FIGS. 20-21, that etch-stop layer 238 is, respectively, omitted or included as desired over upper electrode 236 in manufacturing stage 125 and subsequent stages. Either arrangement is useful. Etch-stop region 238 is desirable when the reagents being used to form via 243 through dielectric layer 240 also attack some or all of layers 220-236.

In manufacturing stage 125 of FIG. 22, via 243 is opened through the portion of dielectric layer 240 (or 228) and etch-stop layer 238 (when present) lying above MTJ 231 to contact upper electrode 236 which is in electrical contact with upper magnetic layer 234 of MTJ 231. Structure 126 results from manufacturing stage 127 of FIG. 23. In manufacturing stage 127, upper interconnect 226 is provided through via 243, thereby making contact with upper electrode 236 and thereby to magnetic layer 234 of MTJ 231. Upper interconnect 226 is preferably formed of Ta, TaN or combinations thereof, but other conductors such as for example and not intended to be limiting, Al, Ti, TiN, and various combinations thereof may also be used. The lateral extent of upper interconnect 226 is adapted to couple MTJ 231 to other MRAM bits and/or other devices and/or contacts (not shown), as are desired to form an array of MRAM bits on a common substrate. Structure 128 results from manufacturing stage 129 of FIG. 24, in which dielectric layer 246 is formed over upper interconnect 226 and dielectric layer 240 (or 228) where exposed. Dielectric layer 246 is analogous to layer 88 of FIGS. 7-8. Silicon oxide is a non-limiting example of a material suitable for dielectric layer 246. Layer 246 has upper surface 247. Upper surface 247 is desirably planarized, that is, rendered smooth and substantially flat by for example, chemical-mechanical polishing, although other procedures may also be used. Planarization is desirable but not essential.

Figure 25:
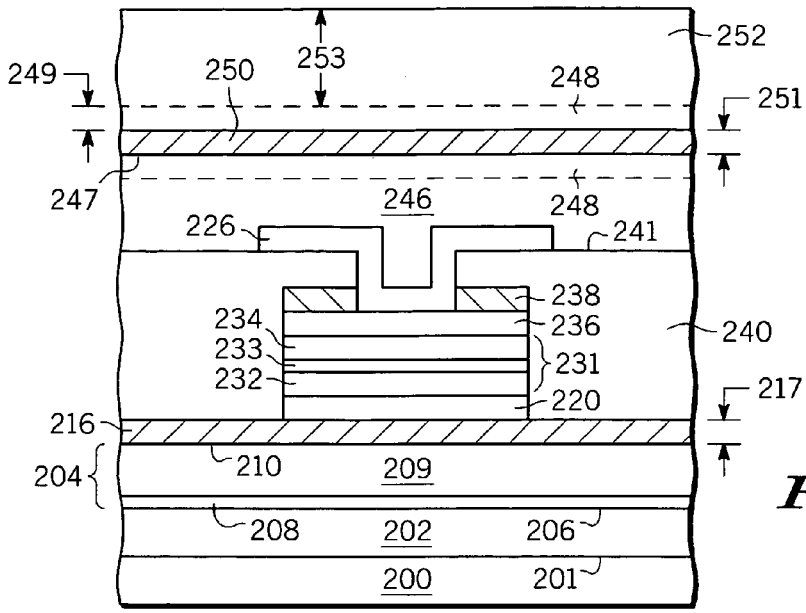

Structure 130 results from manufacturing stage 131 of FIG. 25, in which, one or both of further dielectric layers 248 of thickness 249 and 250 of thickness 251 are applied over dielectric layer 240, according to further embodiments. Dielectric layer 250 is shown hatched to indicate that it is an etch-stop layer analogous to layer 90 of FIGS. 7-8. Magnesium oxide, aluminum oxide and/or aluminum nitride or combinations thereof are non-limiting examples of materials suitable for etch-stop layer 250. Magnesium oxide is preferred. Dielectric layer 248 is shown dashed to indicate that it can be included or omitted depending upon the particular device being constructed. Dielectric layer 248 is conveniently made of silicon nitride and is useful for inhibiting out-diffusion of copper from core 264 of write-line conductor 260 that will be constructed above it (e.g., see FIG. 26). Other dielectric materials may also be used for dielectric layer 248. Dielectric layer 248 may be located above or below etch-stop layer 250. Dielectric layer 248 is desirable but not essential. Thickness 251 is usefully in the range of about 100 to 1200 Angstrom Units, more conveniently in the range of about 200 to 800 Angstrom Units and preferably in the range of about 250 to 450 Angstrom Units. Etch-stop layer 250 is desirable to protect underlying layers or regions including dielectric 246, interconnect 226, MTJ 231 and electrodes 236, etc., from attack during formation of overlying write-line 260. Dielectric layer 252 having thickness 253, of for example silicon oxide, is formed on dielectric layer 250 (and layer 248 if present). Thickness 253 should be sufficient to facilitate subsequent formation of upper write conductor 260 in manufacturing stage 133 of FIG. 26. For convenience of explanation and to avoid unduly cluttering the drawings, layer 248 is omitted in FIG. 26, but this is not intended to be limiting.

Figure 26:
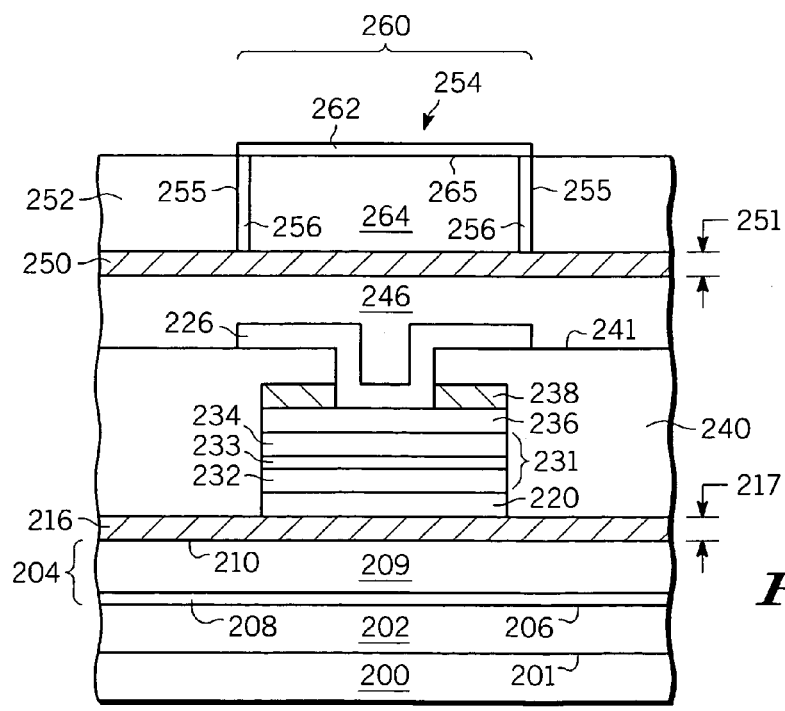

Structure 132 results from manufacturing stage 133 of FIG. 26, wherein upper write conductor 260 is formed. Conductor 260 is also referred to as a bit line and current therein can provide a magnetic field at MTJ 231 to alter its memory state. In manufacturing stage 133 of FIG. 26, channel 254 is etched or otherwise formed in dielectric layer 252 and write conductor 260 is formed in channel 254 in much the same manner as write conductor 204 was formed in dielectric layer 202 of substrate 200. It is desirable that conductor 260 comprise magnetic cladding 256, for example of NiFe, on the lateral sides of channel 254 with conductive core 264, for example of copper, centrally located therebetween. It is desirable but not essential to also provide magnetic cladding 262 on upper surface 265 of conductor 260, that is, the surface opposite from MTJ 231. Such magnetic cladding aids in focusing the magnetic field produced by current flowing through conductor 260 toward MTJ 231. Depending upon whether or not subsequent layers are intended to be formed above conductor 260, conductor 260 and remaining portions of dielectric layer 252 may be planarized, but this is not essential.

Conductors 204 and 260 of FIG. 26 are generally oriented at right angles to each other. In FIG. 26, conductor 204 is oriented parallel to the plane of FIG. 26 and conductor 260 is oriented perpendicular to the plane of FIG. 26. Conductor 204 of FIG. 26 is analogous to conductor 54 of FIG. 7-8 and conductor 260 of FIG. 26 is analogous to conductor 92 of FIG. 7-8. However, in FIGS. 7-8, conductor 54 is oriented perpendicular to the plane of FIGS. 7-8 and conductor 92 is oriented parallel to the plane of FIGS. 7-8. Thus, conductors 204,260 of FIG. 26 are rotated by ninety degrees from the orientation of analogous conductors 54,92 of FIGS. 7-8. The difference in orientation is merely for convenience of representation and has no bearing on the present invention.

Figure 27:
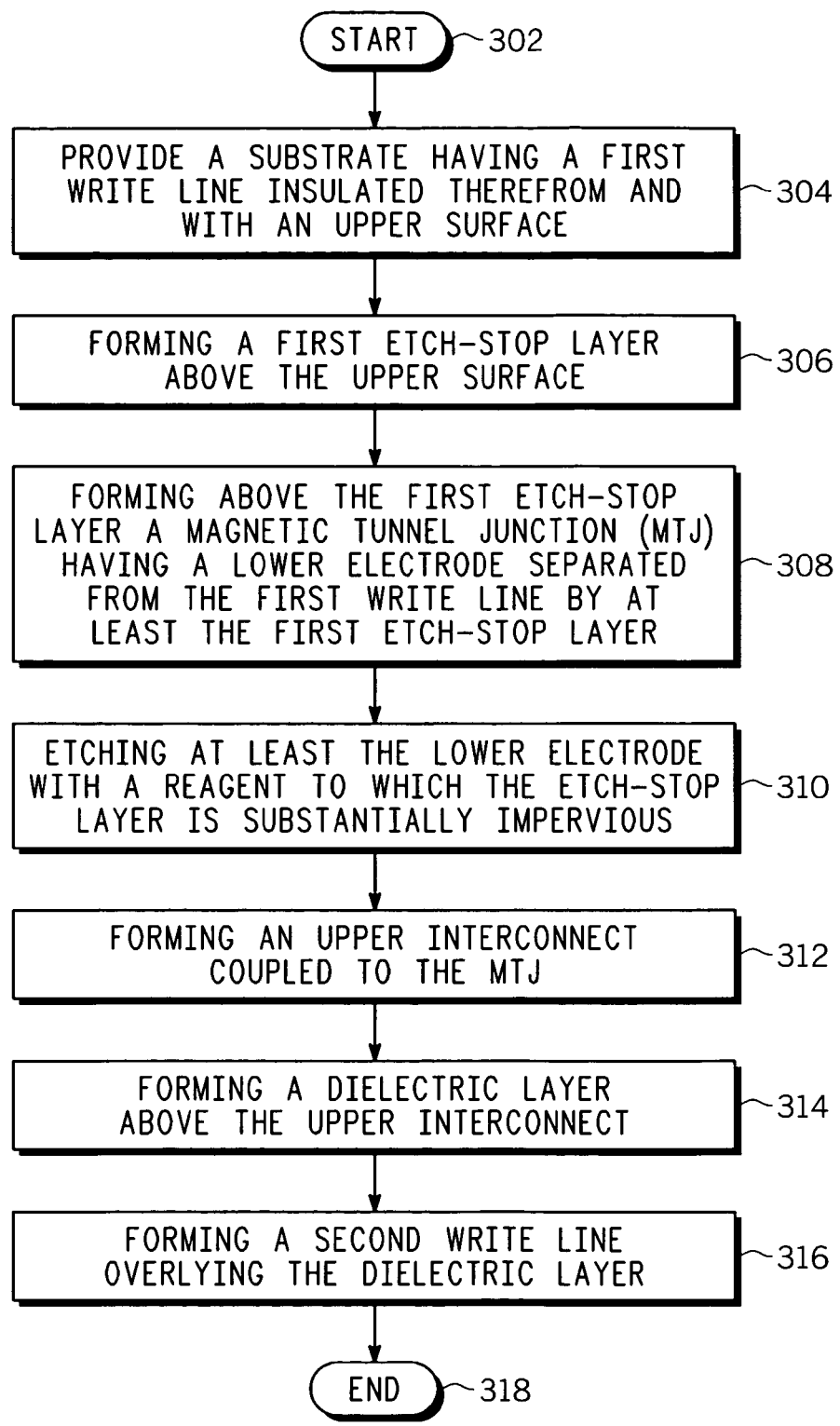
FIGS. 27-28 are simplified schematic flow charts of methods for forming an MRAM bit employing a magnetic tunnel junction (MTJ), and incorporating one or more etch-stop layers according to still further embodiments of the invention.
Figure 28:
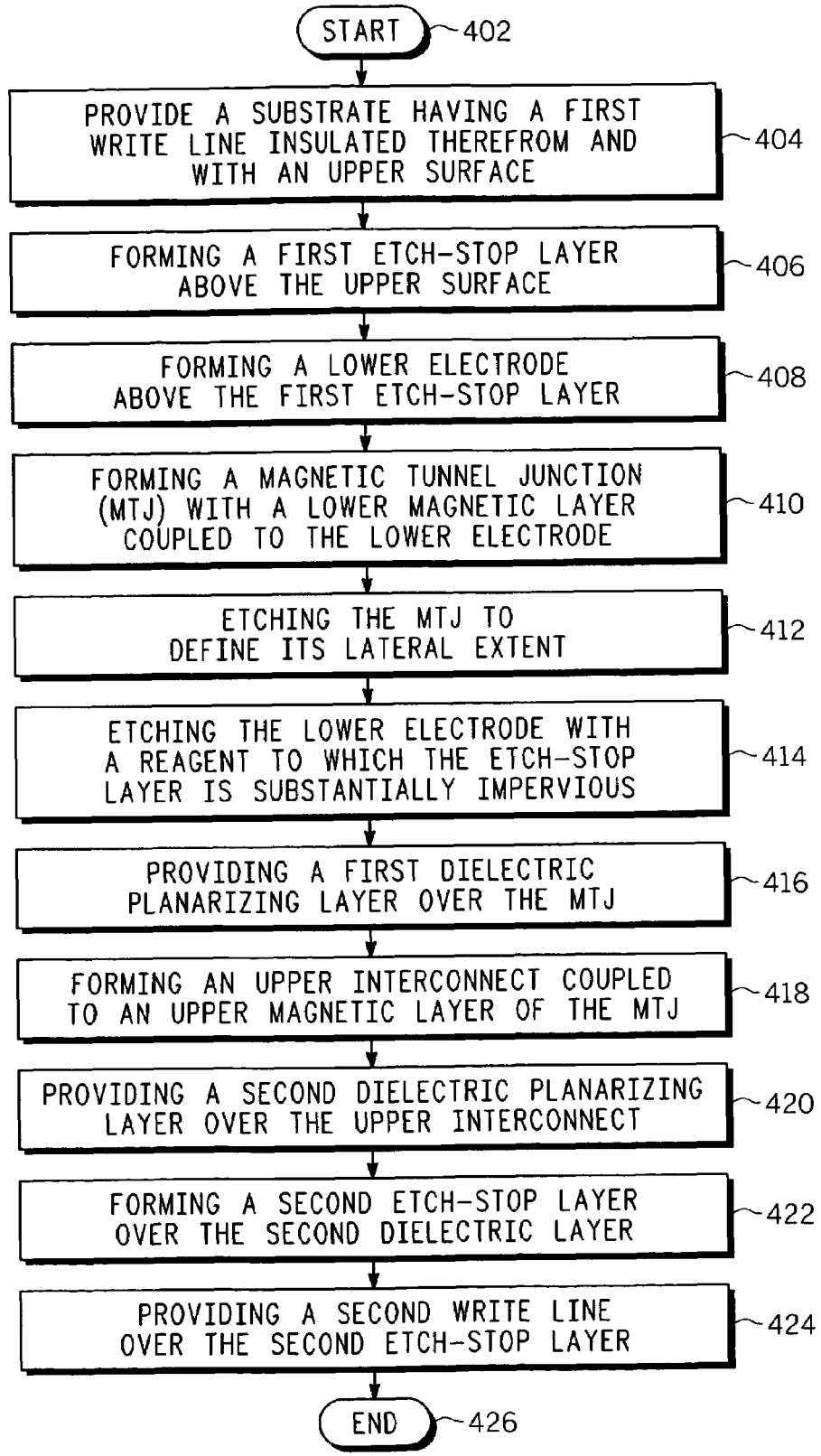

FIGS. 27-28 are simplified schematic flow charts of methods 300, 400 respectively, for forming an MRAM bit employing a magnetic tunnel junction (MTJ), and incorporating one or more etch-stop layers (e.g., 82, 90, 94, 216, 238, and/or 250) according to still further embodiments of the invention. Referring now to FIG. 27, method 300 begins with START 302 and initial step 304 wherein a substrate (e.g., 51, 200) is provided having a first write line (e.g., 54, 204) insulated from the substrate and with an upper surface (e.g., 55, 210). In subsequent step 306, a first etch stop layer (e.g., 82, 216) is formed above the upper surface (e.g., 55, 210). In step 308, a magnetic tunnel junction (MTJ) (e.g., 61, 231) having a lower electrode (e.g., 60, 220) is formed separated from the first write line (e.g., 54, 204) by at least the etch-stop layer (e.g., 82, 216). In step 310, at least the lower electrode (e.g., 60, 220) is etched with a reagent (e.g., halogen containing argon plasma) to which the etch-stop layer (e.g., 82, 216) is substantially impervious (i.e., has a relative etch rate of usefully $\leq 25$ %, conveniently $\leq 15$ % and preferably $\leq 10$ % of the etch rate of layer 60, 220). In step 312, an upper interconnect (e.g., 72, 74) coupled to the MTJ (e.g., 61, 231) is formed. In step 314, a dielectric layer (e.g., 88, 246) is formed above the upper interconnect (e.g., 72, 74). In step 316, a second write line (e.g., is 92, 260) is formed overlying the dielectric layer (e.g., 88, 246). Method 300 then proceeds to END 318. Other steps may also be performed.

Referring now to FIG. 28, wherein method 400 provides further details. Method 400 begins with START 402 and initial step 404 analogous to step 304 of method 300, wherein a substrate (e.g., 51, 200) is provided having a first write line (e.g., 54, 204) insulated from the substrate and with an upper surface (e.g., 55, 210). In subsequent step 406, a first etch stop layer (e.g., 82, 216) is formed above the upper surface (e.g., 55, 210). In step 408, a lower electrode layer (e.g., 60, 220) is formed above the first etch-stop layer (e.g., 82, 216). In step 410, a magnetic tunnel junction (MTJ) (e.g., 61, 231) is formed with a lower magnetic layer (e.g., 62, 232) coupled to the lower electrode (e.g., 60, 220). In step 412, the MTJ (e.g., 61, 231) is etched to define its lateral extent. In step 414, the lower electrode (e.g., 60, 220) is etched with a reagent (e.g., halogen containing plasma) to which the etch stop layer (e.g, 82, 216) is substantially impervious (i.e., has a relative etch rate of usefully $\leq 25$ %, conveniently $\leq 15$ % and preferably $\leq 10$ % of the etch rate of layer 60, 220). In step 416, a first planarizing dielectric (e.g., 89, 236, 240) is provided over the MTJ (e.g., 61, 231). In step 418, an upper interconnect (e.g., 72, 74) is provided coupled to the upper magnetic layer (e.g., 64, 234) of the MTJ (e.g., 61, 231). In step 420, a second planarizing dielectric layer (e.g., 88, 246) is provided over the upper interconnect (e.g., 72, 74). In step 422, a second etch-stop layer (e.g., 90, 250) is provided over the second dielectric layer (e.g., 88, 246). In step 424, a second write line (e.g., 92, 260) is provided over the second etch-stop layer (e.g., 90, 250). Method 400 then proceeds to END 426. Other steps may also be performed.

In a first exemplary embodiment, there is provided a method for forming an array of magnetoresistive random access memory (MRAM) bits embodying magnetic tunnel junctions (MTJ), wherein at least some individual MRAM bits are formed by the method, comprising, providing a substrate comprising first conductive write line insulated from the substrate and having an upper surface, forming a first etch-stop layer above the upper surface, forming above the first etch-stop layer a magnetic tunnel junction comprising upper and lower electrodes wherein the lower electrode is separated from the first write line by at least the first etch-stop layer, etching at least the lower electrode with a reagent to which the etch-stop layer is substantially impervious, forming an upper interconnect coupled to the upper electrode of the MTJ; forming a dielectric layer above the upper interconnect, and forming a second conductive write line overlying the dielectric layer. According to a further embodiment, the lower electrode comprises tantalum or tantalum nitride or a combination thereof. According to a still further embodiment, the etching step comprises etching using a halogen containing reagent. According to a yet further embodiment, the first etch-stop layer comprises magnesium oxide or aluminum oxide or aluminum nitride or a combination thereof. According to a still yet further embodiment, the reagent is a halogen containing plasma. According to a yet still further embodiment, the method further comprises forming a further dielectric layer located between the etch-stop layer and the write line. According to another embodiment, the method further comprises forming a further dielectric layer located between the etch-stop layer and the MTJ.

In a second exemplary embodiment, there is provided a method for forming magnetoresistive memory arrays employing magnetic tunnel junctions (MTJ), comprising, providing a substrate comprising a first conductive write line insulated from the substrate and having an upper surface, forming a first etch-stop layer above the upper surface, forming a first electrode layer above the first etch-stop layer, forming a MTJ with first and second magnetic layers and a tunneling dielectric therebetween, wherein the first magnetic layer is in contact with the first electrode layer and magnetically coupled to the first conductive write line, forming a second electrode in contact a second magnetic layer of the MTJ, etching away portions of the MTJ and first electrode without substantially removing the first etch stop layer, and forming a second conductive write line spaced apart and insulated from the second electrode and magnetically coupled to the MTJ. According to a further embodiment, the etching step comprises etching using a halogen containing reagent. According to a still further embodiment, the first etch-stop layer comprises magnesium oxide or aluminum oxide or aluminum nitride or combinations thereof. According to a yet further embodiment, the first electrode layer comprise tantalum, tantalum nitride or combinations thereof. According to a still yet further embodiment, the method further comprises prior to forming the second conductive write line, forming a second etch-stop layer located between the second electrode and the second conductive write line. According to a yet still further embodiment, the second etch-stop layer comprises magnesium oxide or aluminum oxide or aluminum nitride or combinations thereof. According to another embodiment, the method further comprises, providing a dielectric planarizing layer between the second electrode and the second etch-stop layer.

In a third exemplary embodiment, there is provided a magnetoresistive random access memory (MRAM) array employing magnetic tunnel junction devices (MTJ), comprising a first conductive write line, a magnetic tunnel junction (MTJ) spaced apart from but magnetically coupled to the first conductive write line, wherein the MTJ comprises a first magnetic layer, a second magnetic layer and a tunneling dielectric layer separating the first and second magnetic layers, first and second electrodes coupled respectively to the first and second magnetic layers, a second write conductor spaced apart from but magnetically coupled to the MTJ, and a first etch-stop layer located between the first write conductor and the first electrode, of a material that has an etch rate less than or equal 25 % of the etch rate of the first electrode for the same etchant. According to a further embodiment, the array comprises a second etch-stop layer located between the second write conductor and the second electrode. According to a still further embodiment, the second etch-stop layer comprises a different material than the first etch-stop layer. According to a yet further embodiment, the array further comprises a dielectric planarizing layer located between the second electrode and the second etch-stop layer. According to a still yet further embodiment, the array comprises, an upper interconnect coupled to the second electrode and a further etch-stop region located between a portion of the upper interconnect and a portion of the second electrode. According to a yet still further embodiment, the further etch-stop region substantially laterally surrounds a contact between the upper interconnect and the second electrode.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A method for forming an array of magnetoresistive random access memory (MRAM) bits employing magnetic tunnel junctions (MTJ), wherein at least some individual MRAM bits are formed by the method, comprising:

providing a substrate comprising first conductive write line insulated from the substrate and having an upper surface;

forming a first etch-stop layer above the upper surface;

forming above the first etch-stop layer a magnetic tunnel junction (MTJ) comprising upper and lower electrodes wherein the lower electrode is separated from the first write line by at least the first etch-stop layer;

etching at least the lower electrode with a reagent to which the etch-stop layer is substantially impervious;

forming an upper interconnect coupled to the upper electrode of the MTJ;

forming a dielectric layer above the upper interconnect; and forming a second conductive write line overlying the dielectric layer.

2. The method for forming an array of MRAM bits employing MJT of claim 1, wherein the lower electrode comprises tantalum, tantalum nitride or a combination thereof.

3. The method for forming an array of MRAM bits employing MJT of claim 1, wherein the etching step comprises etching using a halogen containing reagent.

4. The method for forming an array of MRAM bits employing MJT of claim 3, wherein the first etch-stop layer comprises magnesium oxide or aluminum oxide or aluminum nitride or a combination thereof.

5. The method for forming an array of MRAM bits employing MJT of claim 3, wherein the reagent is a halogen containing plasma.

6. The method for forming an array of MRAM bits employing MJT of claim 1, further comprising forming a further dielectric layer located between the etch-stop layer and the write line.

7. The method for forming an array of MRAM bits employing MJT of claim 1, further comprising forming a further dielectric layer located between the etch-stop layer and the MTJ.

8. A method for forming magnetoresistive memory arrays employing magnetic tunnel junctions (MTJ), comprising:
    providing a substrate comprising a first conductive write line insulated from the substrate and having an upper surface;
    forming a first etch-stop layer above the upper surface;
    forming a first electrode layer above the first etch-stop layer;
    forming a MTJ with first and second magnetic layers and a tunneling dielectric therebetween, wherein the first magnetic layer is in contact with the first electrode layer and magnetically coupled to the first conductive write line;
    forming a second electrode in contact a second magnetic layer of the MTJ;
    etching away portions of the MTJ and first electrode without substantially removing the first etch stop layer; and
    forming a second conductive write line spaced apart and insulated from the second electrode and magnetically coupled to the MTJ.

9. The method for forming magnetoresistive memory arrays employing MTJ of claim 8, wherein the etching step comprises etching using a halogen containing reagent.

10. The method for forming magnetoresistive memory arrays employing MTJ of claim 9 wherein the first etch-stop layer comprises magnesium oxide or aluminum oxide or aluminum nitride or combinations thereof.

11. The method for forming magnetoresistive memory arrays employing MTJ of claim 10, wherein the first electrode layer comprise tantalum, tantalum nitride or combinations thereof.

12. The method for forming magnetoresistive memory arrays employing MTJ of claim 8, further comprising prior to forming the second conductive write line, forming a second etch-stop layer located between the second electrode and the second conductive write line.

13. The method for forming magnetoresistive memory arrays employing MTJ of claim 12, wherein the second etch-stop layer comprises magnesium oxide or aluminum oxide or aluminum nitride or combinations thereof.

14. The method for forming magnetoresistive memory arrays employing MTJ of claim 12, further comprising, providing a dielectric planarizing layer between the second electrode and the second etch-stop layer.

\* \* \* \* \*